United States Patent
Okabe et al.

(10) Patent No.: US 8,890,295 B2
(45) Date of Patent: Nov. 18, 2014

(54) PACKAGE FOR MOUNTING A LIGHT EMITTING ELEMENT INCLUDING A FLAT PLATE-SHAPED ELECTRODE AND METHOD FOR MANUFACTURE

(71) Applicant: Shinko Electric Industries Co., Ltd., Nagano-ken (JP)

(72) Inventors: Toshiyuki Okabe, Nagano (JP); Tsuyoshi Kobayashi, Nagano (JP); Toshio Kobayashi, Nagano (JP); Yasuyuki Kimura, Nagano (JP)

(73) Assignee: Shinko Electric Industries Co., Ltd., Nagano-ken (JP)

( * ) Notice: Subject to any disclaimer, the term of this patent is extended or adjusted under 35 U.S.C. 154(b) by 0 days.

(21) Appl. No.: 13/864,402

(22) Filed: Apr. 17, 2013

(65) Prior Publication Data

US 2013/0277701 A1    Oct. 24, 2013

(30) Foreign Application Priority Data

Apr. 19, 2012   (JP) .................................. 2012-095488

(51) Int. Cl.
*H01L 33/38* (2010.01)
*H01L 33/48* (2010.01)
*H01L 33/64* (2010.01)
H01L 33/62 (2010.01)

(52) U.S. Cl.
CPC ............... *H01L 33/38* (2013.01); *H01L 33/486* (2013.01); *H01L 33/642* (2013.01); *H01L 33/647* (2013.01); *H01L 2933/0075* (2013.01); *H01L 33/62* (2013.01); *H01L 2224/48091* (2013.01); *H01L 2224/73265* (2013.01); *H01L 2224/45144* (2013.01)

USPC .... 257/675; 257/100; 257/676; 257/E33.059; 438/26

(58) Field of Classification Search
CPC ...................... H01L 23/49586; H01L 33/647
USPC ............. 257/100, 675, 676, E33.059; 438/26
See application file for complete search history.

(56) References Cited

U.S. PATENT DOCUMENTS

| | | | |
|---|---|---|---|
| 7,768,028 B2* | 8/2010 | Chang et al. ..................... 257/99 |
| 8,058,667 B2* | 11/2011 | Tran et al. ........................ 257/99 |
| 8,253,330 B2* | 8/2012 | Hwu et al. ..................... 313/512 |
| 2005/0199899 A1* | 9/2005 | Lin et al. .......................... 257/99 |
| 2008/0073662 A1* | 3/2008 | Wang et al. ...................... 257/99 |
| 2008/0089072 A1* | 4/2008 | Kim et al. ...................... 362/294 |

FOREIGN PATENT DOCUMENTS

| JP | 2002-280616 A | 9/2002 |
| JP | 2005-197329 A | 7/2005 |

* cited by examiner

*Primary Examiner* — John C Ingham
(74) *Attorney, Agent, or Firm* — Wolf, Greenfield & Sacks, P.C.

(57) ABSTRACT

A package for mounting a light emitting element includes a housing and a flat plate-shaped electrode. The electrode is exposed from a lower surface of the housing. An upper surface of the electrode includes a mounting area on which the light emitting element is mounted. An insulator is arranged on the upper surface of the electrode. An element connector is connected to the insulator. A tubular reflective portion extends from the element connector to a height corresponding to the upper surface of the housing. A terminal is arranged on the side surface of the housing and connected to the reflective portion. A recess accommodates the light emitting element. The recess is formed in an upper portion of the housing, and the recess is formed by the upper surface of the electrode, the element connector, and the reflective portion.

14 Claims, 11 Drawing Sheets

PACKAGE FOR MOUNTING A LIGHT EMITTING ELEMENT INCLUDING A FLAT PLATE-SHAPED ELECTRODE AND METHOD FOR MANUFACTURE

CROSS-REFERENCE TO RELATED APPLICATIONS

This application is based upon and claims the benefit of priority from prior Japanese Patent Application No. 2012-095488, filed on Apr. 19, 2012, the entire contents of which are incorporated herein by reference.

BACKGROUND ART

The present disclosure relates to a package onto which a light emitting element is mounted and a method for manufacturing such a package.

A conventional package for a light emitting element, such as a light emitting diode (LED), may include a resin housing and lead electrodes, which are connected to the light emitting element (refer to, for example, Japanese Laid-Open Patent Publication Nos. 2002-280616 and 2005-197329). The package will now be described briefly. The housing includes a recess (cavity). Two lead electrodes are exposed in the recess. Each lead electrode has one end facing one end of the other lead electrode. A light emitting element is mounted on one lead electrode and connected to the other lead electrode with a wire. The lead electrodes may be bent in correspondence with the mounting method the package. For example, when the package is surface-mounted onto a substrate, the ends of the lead electrodes on the surface opposite to the recess are bent to face each other. This package can be prepared by arranging a lead frame including the lead electrodes in a metal mold, injecting molten resin into the metal mold, and then curing the resin.

SUMMARY

Recent light emitting elements have increased luminance. Such a light emitting element generates more heat as the amount of the supplied current increases. However, the package including the above lead electrodes has relatively low heat radiation. This makes it difficult to efficiently transfer heat out of the package.

One aspect of the present disclosure is a package for mounting a light emitting element. The package is provided with a housing including an upper surface, a lower surface, and a side surface. A flat plate-shaped electrode includes a lower surface and an upper surface. The lower surface of the electrode is exposed from the lower surface of the housing, and the upper surface of the electrode includes a mounting area on which the light emitting element is mounted. An insulator is arranged on a periphery of the upper surface of the electrode. A frame-shaped element connector is connected to an upper surface of the insulator. A tubular reflective portion extends from a periphery of the element connector to a height corresponding to the upper surface of the housing. A terminal is arranged on the side surface of the housing and connected to the reflective portion. A recess accommodates the light emitting element. The recess is formed in an upper portion of the housing. The recess is formed by the upper surface of the electrode, the element connector, and the reflective portion.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF EMBODIMENTS

One embodiment of the present invention will now be described with reference to the drawings. The drawings schematically show structures and are not in actual scale.

Figure 1A:
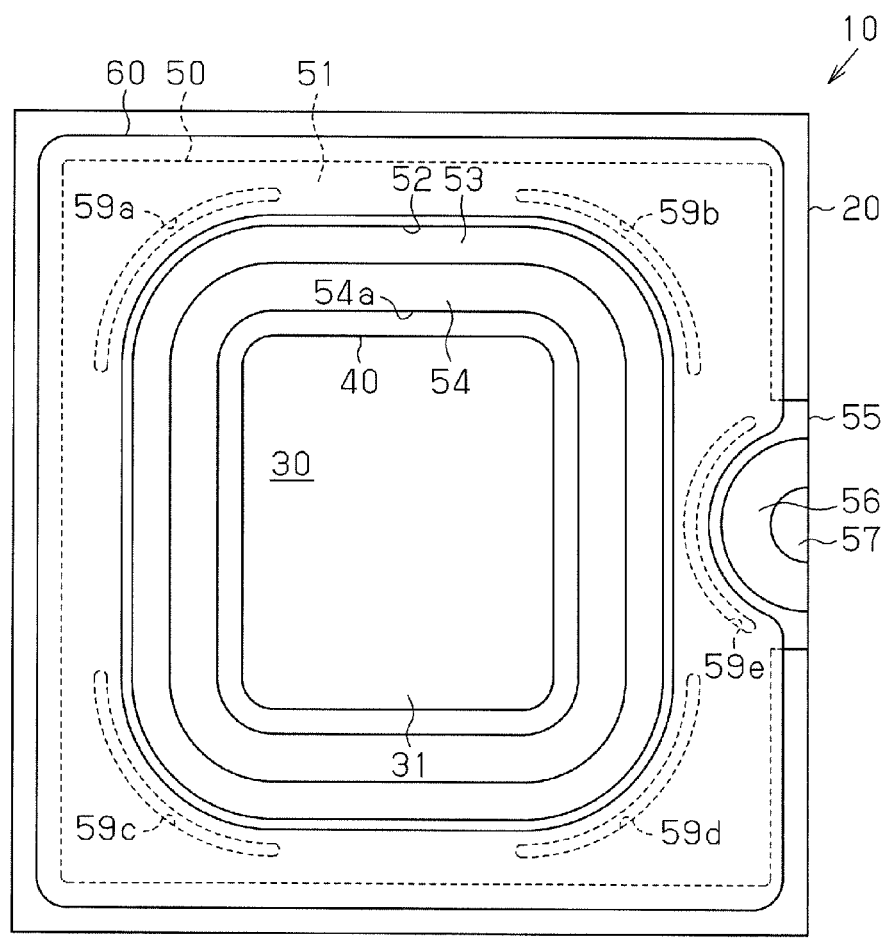
FIG. 1A is a plan view of a package.
Figure 1B:
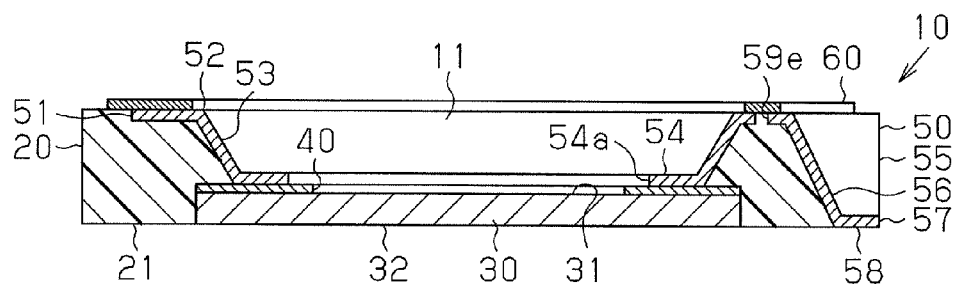
FIG. 1B is a cross-sectional view of the package.
Figure 3:
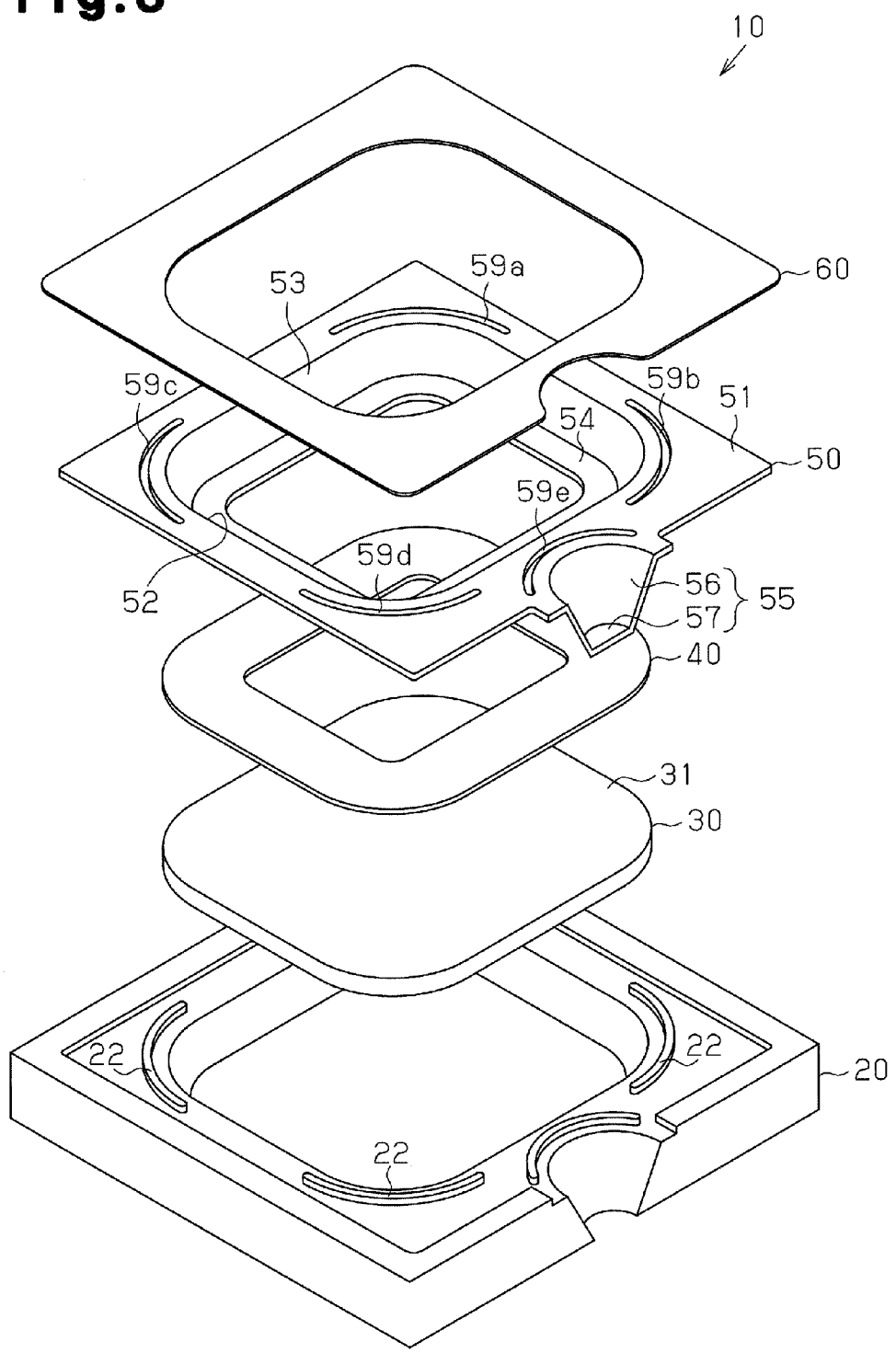
FIG. 3 is an exploded perspective view of the package.

As shown in FIGS. 1A and 1B, the package 10 is a substantially tetragonal and planar structure. As shown in FIG. 3, the package 10 includes a housing 20, a first electrode 30, an insulating sheet 40, and a second electrode 50. In the illustrated example, the package 10 further includes a resist film 60. The first electrode 30 is an example of an electrode. The insulating sheet 40 is an example of an insulator.

The housing 20 is a tetragonal frame. In one example, the housing 20 is prepared by resin-molding the first electrode 30, the insulating sheet 40, and the second electrode 50. The molded product is then cut into tetragonal pieces. The housing 20 may be formed from an insulating resin, such as polyimide resin, epoxy resin, and silicone resin. The housing 20 may also be formed from a resin material obtained by mixing such a resin with a filler of silica or alumina. The housing 20 may be formed from, for example, a white insulating resin. The white insulating resin may be, for example, a resin material containing epoxy resin or organopolysiloxane resin mixed with a white filler or a white pigment such as $TiO_2$ or $BaSO_4$.

Figure 4A:
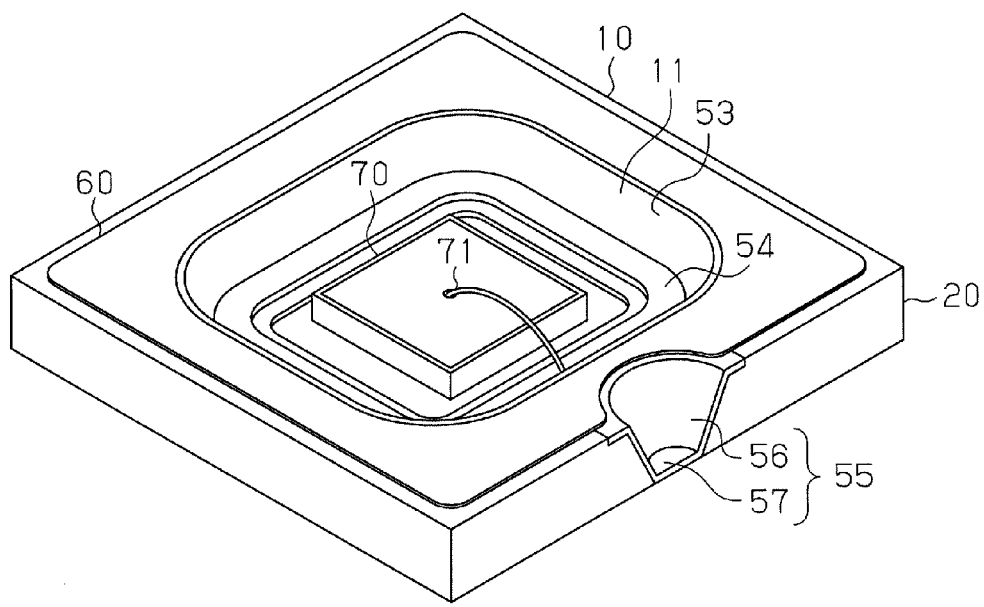
FIG. 4A is a perspective view of a light emitting device including a package on which a light emitting element has been mounted.
Figure 4B:
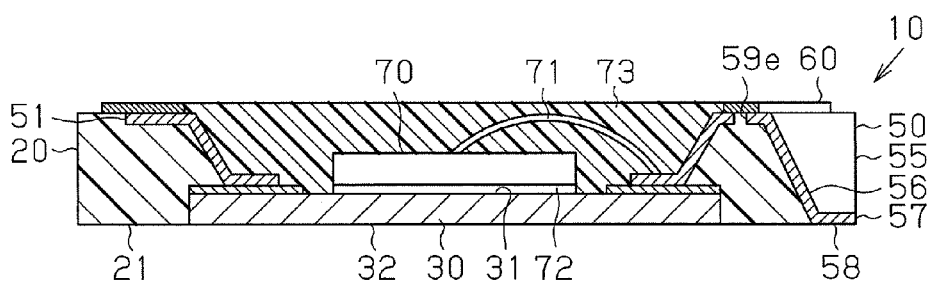
FIG. 4B is a cross-sectional view of the light emitting device of FIG. 4A.

The first electrode 30 is substantially tetragonal and flat plate-shaped. In the illustrated example, the first electrode 30 includes four corners that are rounded to have a predetermined radius. The first electrode 30 has a thickness of, for example, 0.2 to 0.3 millimeters (mm). As shown in FIG. 4A, a light emitting element 70 is mounted on an upper surface 31 of the first electrode 30. The upper surface 31 of the first electrode 30 includes a mounting area for the light emitting element 70. The light emitting element 70, which may be, for example, a high-luminance light emitting diode (LED), includes electrodes on its upper and lower surfaces. As shown in FIG. 4B, the light emitting element 70 is connected to the upper surface 31 of the first electrode 30 with, for example, solder 72. The first electrode 30 is formed from a conductive material. The first electrode 30 may have a size and thickness selected in accordance with the shape and the characteristics (input current and the like) of the light emitting element 70.

Figure 2A:
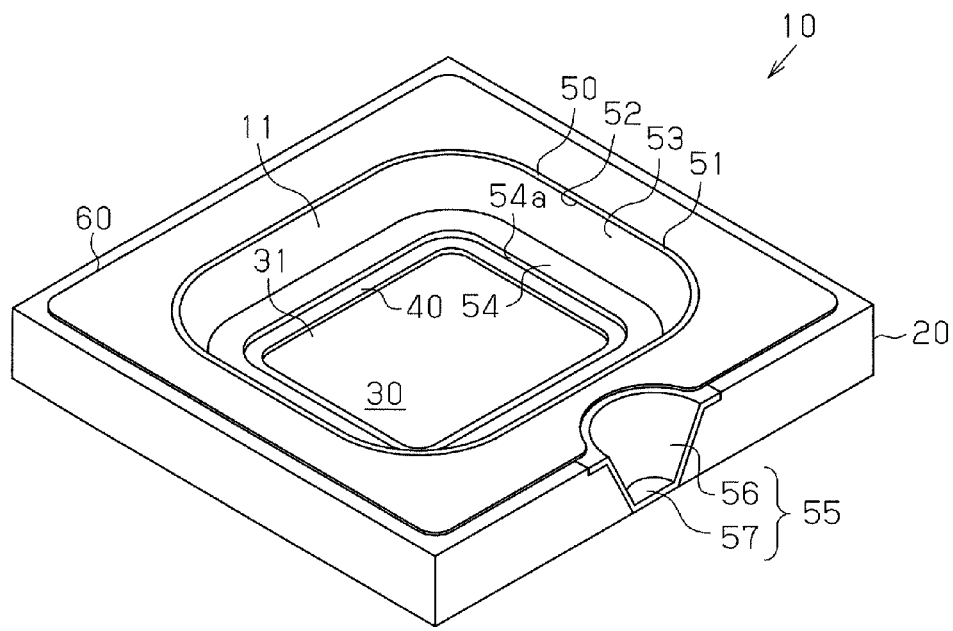
FIG. 2A is an upper perspective view of the package.
Figure 2B:
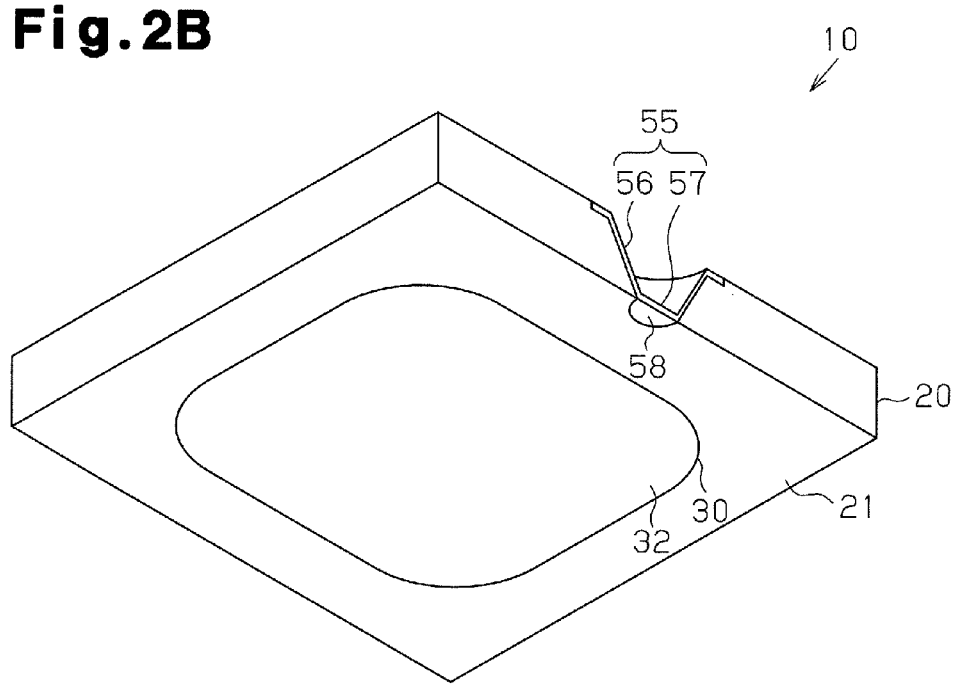
FIG. 2B is a lower perspective view of the package.

As shown in FIGS. 1B and 2B, the first electrode 30 has a lower surface 32 exposed from the lower surface of the package 10. In a preferred example, the lower surface 32 of the first electrode 30 is substantially flush with a lower surface 21 of the housing 20. It is preferable that the entire lower surface 32 of the first electrode 30 be exposed from the lower surface of the package 10. The light emitting element 70 is supplied with power from the exposed first electrode 30. The exposed first electrode 30 may function as a heat-radiating path or a heat-radiating component that releases the heat generated in the light emitting element 70 out of the package 10. The first electrode 30 is formed from a highly conductive material. The first electrode 30 may be formed from, for example, copper (Cu), a Cu-base alloy, a Fe—Ni alloy, or a Fe—Ni-base alloy. The first electrode 30 may be prepared by, for example, etching or stamping a metal plate. The first electrode 30 may be entirely or partially plated. The plated portions of the first electrode 30 may include the mounting area for the light emitting element 70 and the lower surface 32, which is connected electrically to another conductor. The plating may be, for example, silver plating, a laminate of nickel plating and silver plating sequentially formed on the first electrode 30 or a laminate of nickel plating, palladium plating, and silver plating sequentially formed on the first electrode 30. The lower surface of the first electrode 30 may be referred to as a heat radiation-power supply surface.

An insulator, such as the insulating sheet 40 having the shape of a tetragonal frame, is arranged on the periphery of the upper surface of the first electrode 30. The insulating sheet 40 connects the periphery of the upper surface of the first electrode 30 to the second electrode 50. The insulating sheet 40 may be formed from, for example, a highly-insulative resin material, such as polyimide.

The second electrode 50 includes a base 51, which has the shape of a tetragonal frame. The inner edge of the base 51 defines an opening 52, which has four corners rounded to a predetermined radius. The second electrode 50 includes a reflective portion 53, which extends from the inner edge defining the opening 52 toward the first electrode 30. The reflective portion 53, which is substantially tetragonal and tubular, is shaped in conformance with the opening 52. In the illustrated example of FIG. 1B, the reflective portion 53 is tapered to have inner dimensions that decrease from its upper end (the inner edge defining the opening 52) toward its lower end. The inner side surface of the reflective portion 53 may function as an inclined reflective surface that is continuous with the base 51.

A frame-shaped element connector 54 is connected to the upper surface of the insulating sheet 40. The element connector 54 extends from the lower end of the reflective portion 53. The element connector 54 is a substantially tetragonal frame that is parallel to the base 51. The element connector 54 is parallel to the upper surface 31 of the first electrode 30. The insulating sheet 40 connects the element connector 54 to the periphery of the upper surface of the first electrode 30. The reflective portion 53, the element connector 54, and the first electrode 30, which is connected to the element connector 54, define a recess 11 in the upper surface of the package 10. As shown in FIG. 4A, the recess 11 forms a cavity, in which the light emitting element 70 is mounted.

A wire 71 electrically connects the element connector 54 to the light emitting element 70. In the illustrated example of FIG. 4A, the wire 71 includes one end connected to the upper surface of the element connector 54 and another end connected to the electrode arranged on the upper surface of the light emitting element 70.

The second electrode 50 includes a terminal 55. As shown in FIGS. 1A and 2A, the terminal 55 is located at a substantially middle position in one side of the package 10.

The terminal 55 includes a semi-circular side wall 56, and a substantially semi-circular connecting terminal 57, which extends from the lower end of the side wall 56. As shown in FIG. 1B, the side wall 56 extends from the upper surface to the lower surface of the package 10. As shown in FIGS. 1B and 2B, a lower surface 58 of the connecting terminal 57 is substantially flush with the lower surface 21 of the housing 20 in the same manner as the first electrode 30. In other words, the lower surface 58 of the connecting terminal 57 is exposed from the lower surface of the package 10. The light emitting element 70 is supplied with power from the exposed connecting terminal 57 through the second electrode 50 and the wire 71 (refer to FIG. 4A).

In the illustrated example, the base 51 of the second electrode 50 includes a plurality of slits 59a to 59e. The second electrode 50 is obtained by, for example, stamping (drawing) a metal plate having a predetermined thickness (0.1 mm, for example). This allows the base 51, the reflective portion 53, the element connector 54, and the terminal 55 to be formed from an integral metal plate.

The second electrode 50 is formed from a conductive material having high processability. The second electrode 50 may be formed from, for example, Cu, a Cu-base alloy, a Fe—Ni alloy, or a Fe—Ni-base alloy. The second electrode 50 is entirely or partially plated. The plated portions of the second electrode 50 may include the inner side surface of the reflective portion 53, the upper surface of the element connector 54, and the lower surface 58 of the connecting terminal 57. The plating may be, for example, silver plating, a laminate of nickel plating and silver plating sequentially formed on a metal plate or a laminate of nickel plating, palladium plating, and silver plating sequentially formed on a metal plate. The use of silver plating, or the use of the uppermost silver plating layer in the laminated plating layers, effectively increases the reflection of light emitted from the light emitting element 70.

The slits 59a to 59d prevent or reduce distortion or the like of the reflective portion 53 and the element connector 54 that may occur during processing of the second electrode 50. The slit 59e prevents or reduces distortion or the like of the terminal 55 that may occur during processing of the second electrode 50. In the illustrated example, the slits 59a to 59e are filled with resin that forms the housing 20 (refer to resin portions 22 in FIG. 3). The resin portions 22 fitted in the slits 59a to 59e allow for closer contact between the housing 20 and the second electrode 50.

The resist film 60 substantially covers the upper surface of the housing 20 and the upper surface of the second electrode 50. The resist film 60 is formed from, for example, a white insulating resin. The white resist film 60 may also function as a reflective film. The white insulating resin may be, for example, a resin material containing epoxy resin or organopolysiloxane resin mixed with a white filler or a white pigment such as $TiO_2$ or $BaSO_4$.

The operation of the package 10 will now be described.

As shown in FIGS. 4A and 4B, a light emitting device includes the package 10 and the light emitting element 70 mounted on the package 10. The light emitting element 70 is, for example, a high-luminance light emitting diode (LED). The solder 72, for example, electrically connects the light emitting element 70, which is mounted on the upper surface 31 of the first electrode 30, to the first electrode 30. The solder may be formed from, for example, an alloy containing Pb, a Sn—Au alloy, a Sn—Cu alloy, a Sn—Ag alloy, or a Sn—Ag—Cu alloy. The material for connecting the light emitting element 70 to the first electrode 30 may be a conductive paste, such as a silver paste, or a conductive resin.

The first electrode 30 is plate-shaped and has an upper surface 31 that is larger than the footprint of the light emitting element 70. The upper surface 31 is partially exposed from the light emitting element 70. This allows the upper surface 31 of the first electrode 30 and the lower surface of the light emitting element 70 to be connected to each other with a low resistance. The entire lower surface of the light emitting element 70 is connected to the upper surface of the first electrode 30. Heat in the light emitting element 70 is transferred from the entire lower surface of the light emitting element 70 to the first electrode 30. The first electrode 30, which is plate-shaped and has a predetermined thickness, efficiently transfers the heat of the light emitting element 70 from its upper surface to its lower surface and thereby release the heat out of the package 10 from the lower surface of the first electrode 30. The first electrode 30 allows for higher radiation of heat generated in the light emitting element 70.

The wire 71 includes one end connected to the upper surface of the light emitting element 70 and another end connected to the upper surface of the element connector 54 of the second electrode 50. The wire 71 may be, for example, a gold (Au) wire. The element connector 54 has the shape of a frame. This allows the wire 71 to extend in any direction to the light emitting element 70. This structure has no limitation in the connecting direction of the wire 71, and reduces limitations (e.g., directions of the package 10 and the light emitting element 70) imposed on a bonding apparatus that is used to connect the wire 71.

The light emitting element 70, which is mounted in the recess (cavity) 11 of the package 10, is covered by a transparent resin material 73 filled in the recess 11. A silicone resin may be used as the transparent resin material 73. The resin material 73 may contain, for example, a phosphor. FIGS. 4A, 5, 6, and 11 do not show the resin material 73. A further element such as a lens may also be mounted on the package 10.

Figure 5:
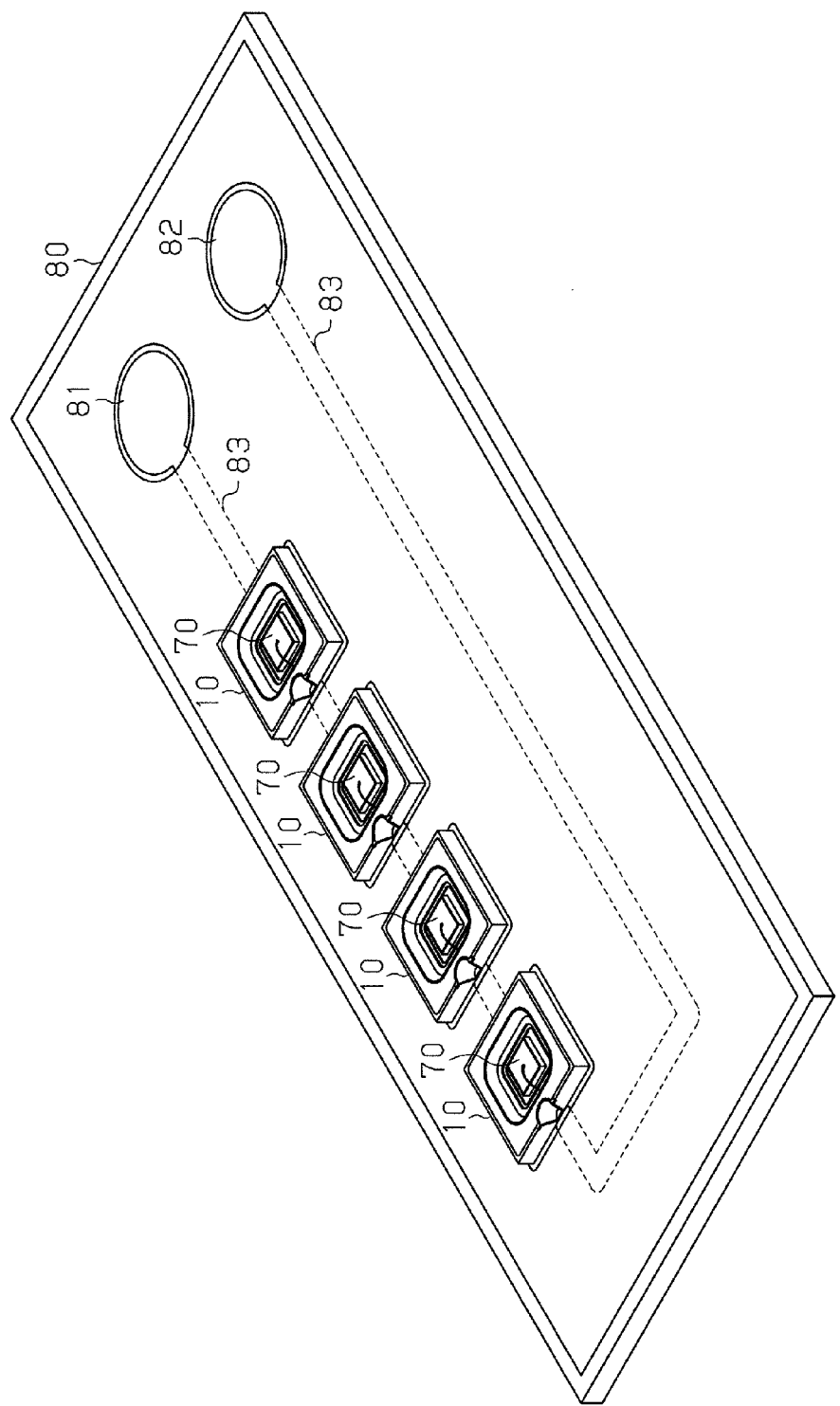
FIG. 5 is a perspective view of a substrate on which packages have been mounted.
Figure 6:
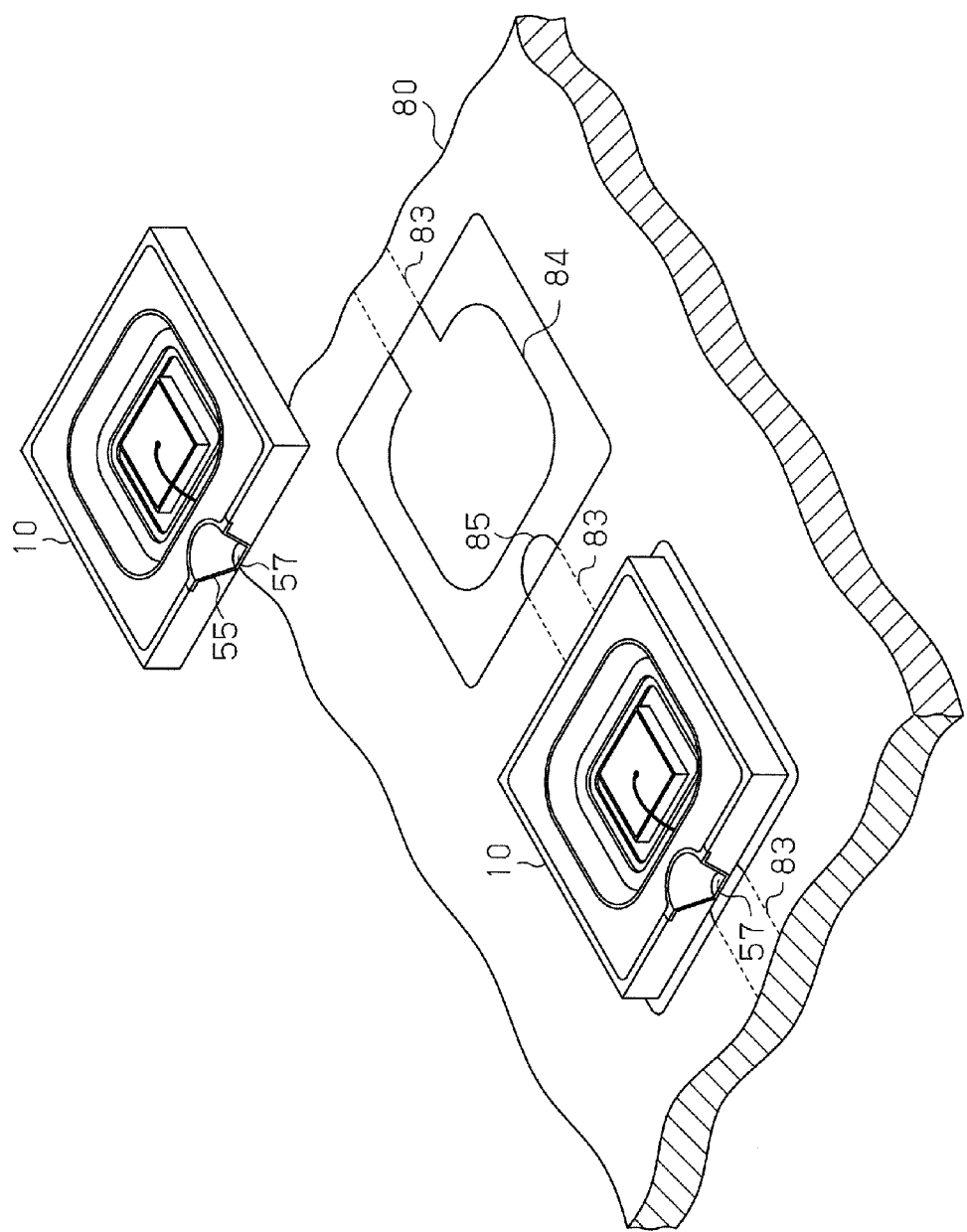
FIG. 6 is a perspective view illustrating the mounting of a package onto a substrate.

As described above, the light emitting device including the light emitting element 70 and the package 10 is mounted on a substrate 80 as shown in FIG. 5. Power supply pads 81 and 82 and a wiring pattern 83, which is connected to the power supply pads 81 and 82, are formed on the substrate 80. As shown in FIG. 6, the substrate 80 includes a substantially tetragonal connecting pad 84, to which the first electrode 30 of the package 10 is connected, and a connecting pad 85, to which the terminal 55 (connecting terminal 57) of the package 10 is connected. The power supply pads 81 and 82 and the wiring pattern 83 supply the package 10 shown in FIG. 5 with drive current.

The light emitting element 70, which is connected to the substrate 80 as described above, emits light when supplied with current. The reflective portion 53 reflects some of the light emitted from the light emitting element 70. The surface of the reflective portion 53 is inclined and reflects light upward. The white resist film 60, which is on the upper surface of the package 10, further reflects the light upward from the package 10. This allows for efficient use of the light emitted from the light emitting element 70.

The procedures for manufacturing the package 10 will now be described.

Figure 7A:
FIGS. 7A, 7B, 7C, and 7D are schematic cross-sectional views illustrating manufacturing steps of the package.

As shown in FIG. 7A, a metal plate 100 having a predetermined thickness is first prepared. The metal plate 100 may have a thickness of, for example, 0.1 mm.

Figure 7B:

As shown in FIG. 7B, a through-hole 101 is formed in the metal plate 100 by, for example, performing etching or stamping. The size of the through-hole 101 corresponds with the size of an inner opening 54a of the element connector 54 as shown in FIG. 1A. As shown in FIG. 4A, the size of the through-hole 101 is determined in accordance with the dimensions of the light emitting element 70 that is to be mounted. In one example, the slits 59a to 59e shown in FIG. 1A can be formed simultaneously with when the through-hole 101 is formed.

Figure 7C:
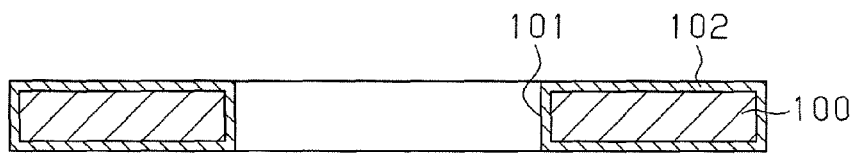
Figure 7D:
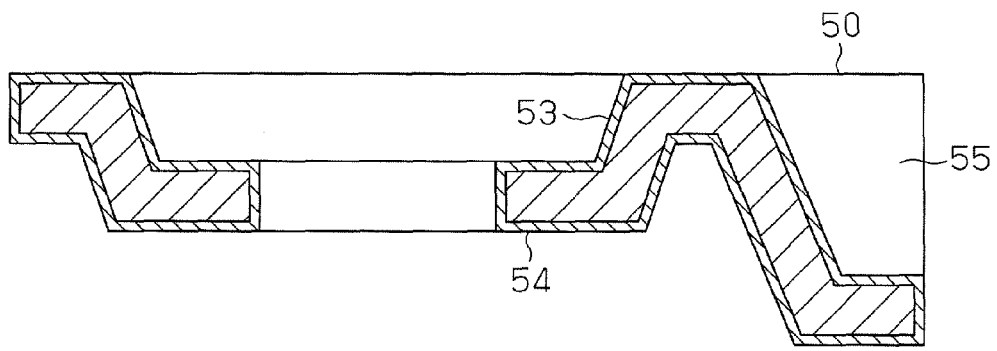

As shown in FIG. 7C, the entire surface of the metal plate 100, including the inner surface of the through-hole 101, is plated to form a plating layer 102. Subsequently, the metal plate 100 undergoes stamping (drawing) to form the second electrode 50 shown in FIG. 7D. The plating layer 102 may be formed after the stamping (drawing).

Figure 8A:
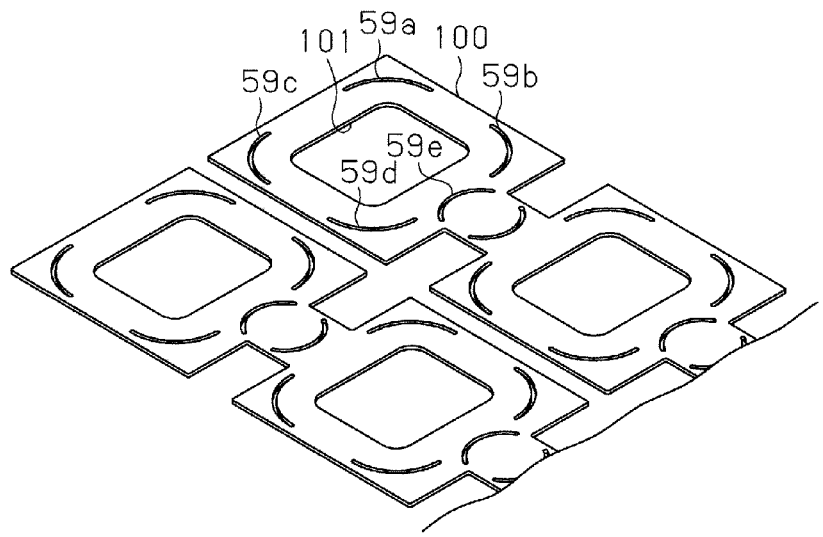
FIGS. 8A and 8B are perspective views illustrating manufacturing steps of the package.
Figure 8B:
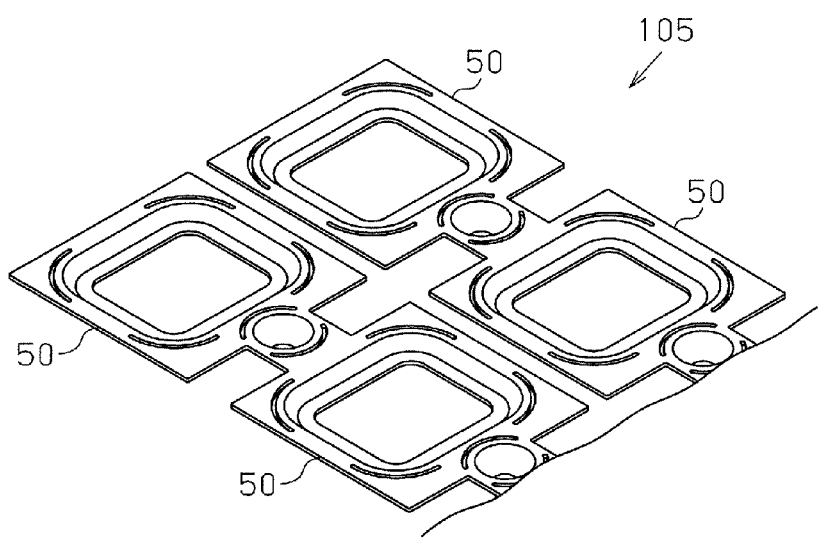

Although FIGS. 7A to 7D illustrate the procedures for forming a single second electrode 50, it is preferable that a plurality of second electrodes 50 be simultaneously formed from the metal plate 100. As shown in FIG. 8A, for example, multiple sets of the through-hole 101 and the slits 59a to 59e may be formed in an integral metal plate. Then, as shown in FIG. 8B, stamping (drawing) is performed to form a lead frame 105 including a plurality of connected second electrodes 50, each including the reflective portion 53, the element connector 54, and the terminal 55.

Figure 9A:
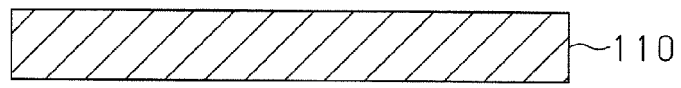
FIGS. 9A and 9B are schematic cross-sectional views illustrating manufacturing steps of the package.

As shown in FIG. 9A, a metal plate 110 with a predetermined thickness is prepared. The metal plate 110 may have a thickness of, for example, 0.2 mm.

Figure 9B:
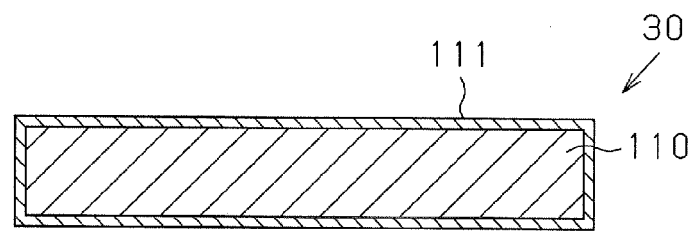

The entire surface of the metal plate 110 is plated to form a plating layer 111. This completes the first electrode 30 shown in FIG. 9B.

Figure 10A:
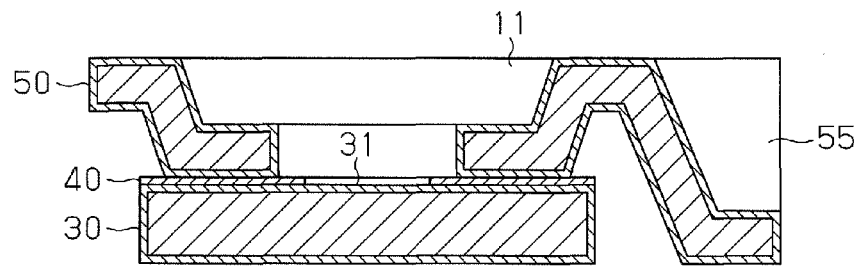
FIGS. 10A, 10B, 10C, and 10D are schematic cross-sectional views illustrating manufacturing steps.

As shown in FIG. 10A, an insulating sheet 40, to which an adhesive or the like has been applied, is prepared. The insulating sheet 40 connects the second electrode 50 to the upper surface 31 of the first electrode 30. The first electrode 30 is connected to the second electrode 50, which is included in the lead frame 105 shown in FIG. 8A.

Figure 10B:
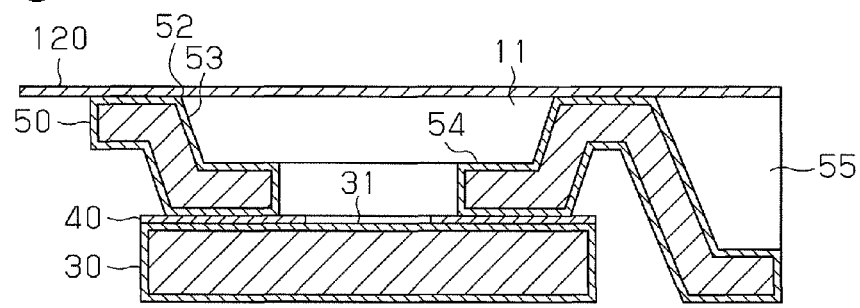

As shown in FIG. 10B, a mold tape 120 is adhered to the upper surface of the lead frame 105 (second electrode 50), which is shown in FIG. 8B. The mold tape 120 covers the opening 52 of the second electrode 50, or the inner side surface of the reflective portion 53, the element connector 54, and the middle area of the upper surface 31 of the first electrode 30. Although FIG. 10B illustrates the terminal 55 as if it is open in the horizontal direction (rightward in the drawing), adjacent second electrodes 50 are continuously formed in the lead frame 105 as shown in FIG. 8B. The mold tape 120 shown in FIG. 10B covers and closes the truncated conical recess, which is used to form the terminal 55.

Figure 10C:
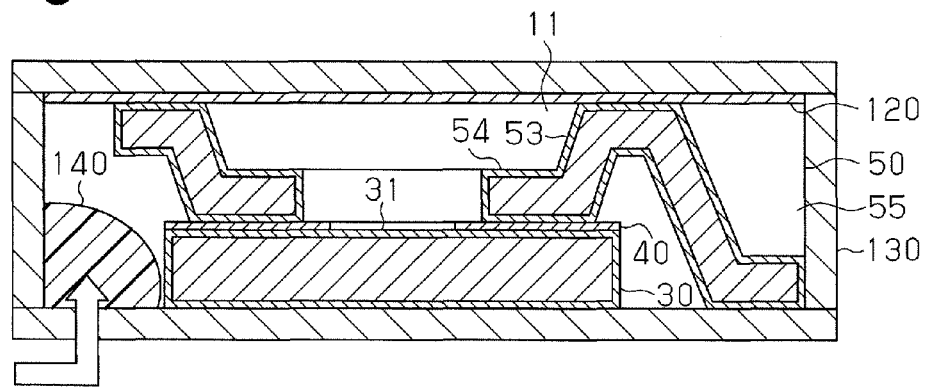

As shown in FIG. 10C, the product shown in FIG. 10B including the first electrode 30 is set in a metal mold 130. Resin 140 is then injected into the metal mold 130. Although FIG. 10C illustrates the metal mold 130 accommodating a single first electrode 30 and a single second electrode 50, it is preferable that the metal mold 130 be able to accommodate the lead frame 105 shown in FIG. 8B and the first electrodes 30, which are connected to the second electrodes 50 of the lead frame 105 by the insulating sheet 40.

The metal mold 130 is box-shaped. The inner height of the metal mold 130 is substantially the same as the height from the lower surface 32 of the first electrode 30 to the upper surface of the second electrode 50. When the metal mold 130 is closed, the lower surface 32 of the first electrode 30 comes into contact with the inner surface of the metal mold 130. Thus, the lower surface 32 of the first electrode 30 is not covered by the resin 140. The frame-shaped insulating sheet 40 connects the element connector 54 of the second electrode 50 and the upper surface 31 of the first electrode 30. The upper surface of the second electrode 50 is covered by the mold tape 120. This prevents the resin 140 from entering the recess 11 (cavity), which is formed by the second electrode 50 and the first electrode 30, and the recess for the terminal 55.

Figure 10D:
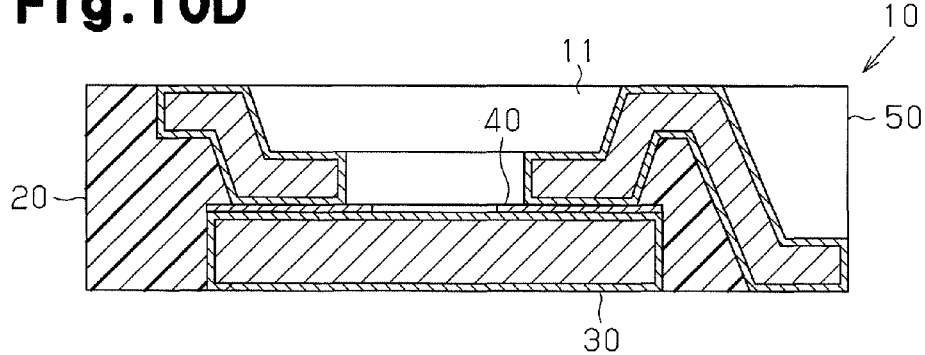

The resin 140 injected in the metal mold 130 is cured. Then, the molded product is removed from the metal mold 130, and the mold tape 120 is removed. A resin material is then applied to the upper surface of the second electrode 50 by, for example, performing screen printing. This forms the resist film 60. Subsequently, the lead frame 105 is cut and singulate. This forms the package 10 shown in FIG. 10D.

The above embodiment has the advantages described below.

(1) The package 10 includes the first electrode 30, which is plate-shaped. The lower surface 32 of the first electrode 30 is substantially flush with the lower surface 21 of the housing 20 and exposed from the lower surface 21 of the housing 20. The light emitting element 70 is connected to the upper surface 31 of the first electrode 30. The heat of the light emitting element 70 is transferred from the entire lower surface of the light emitting element 70 to the first electrode 30. The first electrode 30 is plate-shaped and has a predetermined thickness. The heat of the light emitting element 70 is efficiently transferred from the upper surface toward the lower surface of the first electrode 30. The package 10 thus allows for high radiation of the heat generated by the light emitting element 70.

(2) The insulating sheet 40 connects the element connector 54 of the second electrode 50 to the periphery of the upper surface of the first electrode 30. The element connector 54 is a tetragonal frame. The wire 71 includes one end connected to the light emitting element 70 and another end connected to the element connector 54. The element connector 54, which is frame-shaped, allows easy changing of the connecting direction of the wire 71. This reduces limitations (e.g., directions of the package 10 and the light emitting element 70) imposed on a bonding apparatus that is used to connect the wire 71.

(3) The reflective portion 53 is formed by bending the metal plate of the second electrode 50 so that the reflective portion 53 is inclined toward the upper end of the package 10. This allows for efficient reflection of light emitted from the light emitting element 70 so that the reflected light travels upward from the package 10. The metal plate is thick enough to have sufficient processability. Accordingly, the reflective portion 53 can be formed easily. The formation of the reflective portion 53 from a metal plate allows for the reflective portion 53 to be plated. The plating allows for efficient reflection of the light emitted from the light emitting element 70.

(4) The frame-shaped insulating sheet 40 connects the element connector 54 of the second electrode 50 to the periphery of the upper surface of the first electrode 30, which is plate-shaped. The element connector 54 is a tetragonal frame. The reflective portion 53, which is substantially tetragonal and tubular, extends upward from the peripheral edge of the element connector 54. The recess 11, which is surrounded by the reflective portion 53, the element connector 54, and the first electrode 30, forms a cavity, in which the light emitting element 70 is mounted.

The package 10 eliminates the need for a metal mold having a complicated shape including, for example, a protrusion for forming a cavity). This differs from a package including a cavity formed in a metal mold. More specifically, the package 10 having the recess 11 only uses the metal mold 130, which has the simple shape of a substantially tetragonal box. Thus, the package 10 reduces costs as compared with a package that uses a metal mold to form a cavity.

(5) Since there is no need to use a metal mold to form a cavity, the molded product may easily be removed more easily from the metal mold 130 than when using a metal mold to forming the cavity or the like. This shortens the time during which an apparatus used for resin molding (transfer molding) is stopped and thereby improves productivity. Thus, manufacturing costs may be reduced.

(6) There is no need to use a metal mold to form a cavity. Thus, the shape of the cavity may be easily changed. Since there is no need to produce a metal mold whenever there is a change in the cavity, manufacturing costs of the package 10 can be reduced.

It should be apparent to those skilled in the art that the present invention may be embodied in many other specific forms without departing from the spirit or scope of the invention. Particularly, it should be understood that the present invention may be embodied in the following forms.

The package 10 does not have to be singulated after resin molding. The resin molding may be performed after the singulation process.

It is only required that the lower surface 58 of the connecting terminal 57 included in the terminal 55 be substantially flush with the lower surface 21 of the housing 20. The side wall 56 of the terminal 55 may be covered by resin.

A vertical cavity surface emitting laser (VCSEL) may be used as the light emitting element. The light emitting element should not be limited to an element that outputs light in the visible region. The light emitting element may output ultraviolet rays or infrared rays.

Figure 11:
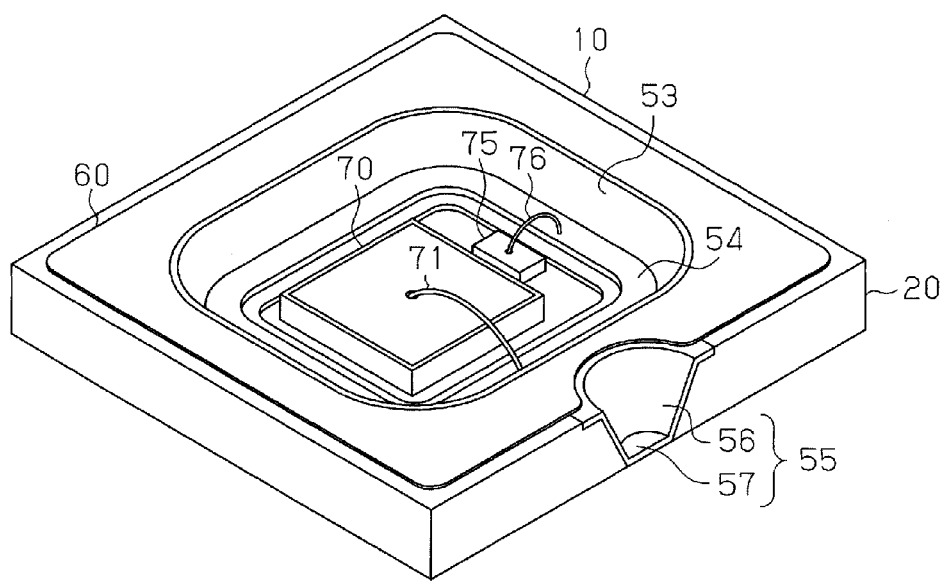
FIG. 11 is a perspective view of a package on which a plurality of elements have been mounted.

As shown in FIG. 11, for example, the light emitting element 70 and a zener diode 75 may be mounted on the package 10. In the same manner as the light emitting element 70, the zener diode 75 also includes electrodes on its upper and lower surfaces for connection. In the same manner as the light emitting element 70, solder or a conductive paste electrically connects the zener diode 75 to the first electrode 30, and a wire 76 electrically connects the zener diode 75 to the element connector 54. FIG. 11 does not show resin that covers the light emitting element 70 and the zener diode 75.

Any element other than a zener diode may be mounted on the package 10. For example, a light emitting element, a protective element (e.g., zener diode or capacitor) that protects such a semiconductor element from damages caused by overvoltage, or a combination of such elements may be mounted on the package 10. The element connector 54 for connecting the elements is frame-shaped. This allows the mounted elements to be arranged at any position that does not affect the light emitting element 70 and allows a wire to be connected to the element connector 54.

Figure 12:
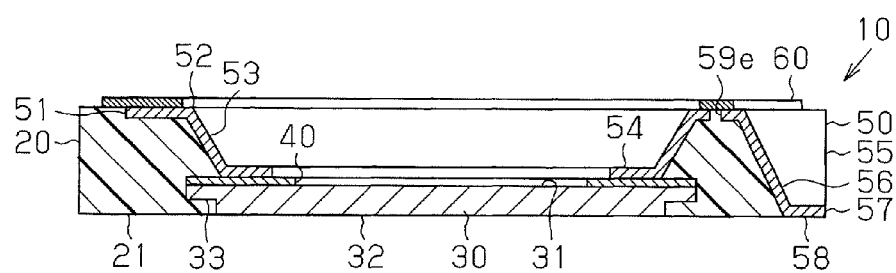
FIG. 12 is a cross-sectional view of another package.

The shape of the first electrode 30 may be changed. For example, the first electrode 30 may have a flange 33 as shown in FIG. 12. The flange 33 may be formed by, for example, stamping or etching. The flange 33 allows for closer contact between the first electrode 30 and the resin that forms the housing 20. In another example, the first electrode 30 may have a lower surface 32 having a larger area than the upper surface 31. For example, the first electrode 30 may be in the shape of a frustum.

The present examples and embodiments are to be considered as illustrative and not restrictive, and the invention is not to be limited to the details given herein, but may be modified within the scope and equivalence of the appended claims.

The invention claimed is:

1. A package for mounting a light emitting element, the package comprising:
   a housing including an upper surface, a lower surface, and a side surface;
   a flat plate-shaped electrode including a lower surface and an upper surface, wherein the lower surface of the electrode is exposed from the lower surface of the housing, and the upper surface of the electrode includes a mounting area on which the light emitting element is mounted;
   an insulator arranged on a periphery of the upper surface of the electrode;
   a frame-shaped element connector connected to an upper surface of the insulator;
   a tubular reflective portion that extends from a periphery of the element connector to a height corresponding to the upper surface of the housing;
   a terminal arranged on the side surface of the housing and connected to the reflective portion;
   a recess that accommodates the light emitting element, wherein the recess is formed in an upper portion of the housing, and the recess is formed by the upper surface of the electrode, the element connector, and the reflective portion; and
   a frame-shaped base arranged on the upper surface of the housing and connected to the reflective portion, wherein the terminal is connected to the base.

2. The package according to claim 1, wherein the upper surface of the electrode and the element connector each include a portion connected to an electrode of the light emitting element.

3. The package according to claim 1, wherein the terminal includes
   an arc-shaped side wall that includes an upper end connected to a base and a lower end extending to the lower surface of the housing, and the side wall has a diameter that increases toward the upper end, and
   a connecting terminal that is connected to the lower end of the side wall and exposed from the lower surface of the housing.

4. The package according to claim 3, wherein the element connector, the terminal, the reflective portion, and the base are formed from an integral metal plate.

5. The package according to claim 4, wherein the electrode is a metal plate that is thicker than each of the element connector and the reflective portion.

6. The package according to claim 1, wherein the reflective portion is tubular and includes an opening with a diameter that increases from the element connector toward the upper surface of the housing.

7. The package according to claim 1, wherein the housing is a plate-shaped and is formed from an insulating resin.

8. The package according to claim 1, wherein the lower surface of the electrode is exposed from the lower surface of the housing and forms a heat radiation-power supply surface.

9. The package according to claim 1, wherein the lower surface of the electrode is entirely flush with the lower surface of the housing.

10. A light emitting device comprising:
    the package according to claim 1;
    a light emitting element accommodated in the recess of the package; and
    a light transmissive resin material filled in the recess of the package; and
    a light transmissive resin material filled in the recess to cover the light emitting element.

11. A method for manufacturing a package for mounting a light emitting element, the method comprising:
    forming a flat plate-shaped electrode from a first metal plate;
    forming an opening in a second metal plate and bending the second metal plate to form a frame-shaped element connector surrounding the opening and to form a tubular reflective portion that is connected to the element connector;
    connecting the element connector to a periphery of an upper surface of the electrode with an annular insulating sheet; and
    setting the second metal plate and the electrode in a metal mold so that the metal mold closes a recess that is surrounded by the electrode, the element connector, and the reflective portion, and injecting resin into the metal mold.

12. The method according to claim 11, further comprising covering an upper surface of the second metal plate with a mold tape, wherein
    the metal mold includes a mold cavity into which the second metal plate covered by the mold tape and the electrode are set, and
    the mold cavity has a height equal to a height from a lower surface of the electrode to an upper surface of the mold tape.

13. The method according to claim 11, wherein the resin injected into the metal mold forms a housing, and the housing is connected to the second metal plate and to a peripheral side surface of the electrode and formed from an insulating resin.

14. The method according to claim 13, wherein
    the bending the second metal plate includes forming a terminal connected to the reflective portion on the second metal plate, and
    injecting the resin includes injecting the resin into the metal mold so that the terminal is located on a side surface of the housing.

* * * * *